United States Patent [19]
Tong et al.

[11] Patent Number: 5,199,178
[45] Date of Patent: Apr. 6, 1993

[54] THIN FILM COMPASS AND METHOD FOR MANUFACTURING THE SAME

[75] Inventors: Hing S. Tong, Saratoga; Fai-Loy P. Lam, San Mateo, both of Calif.

[73] Assignee: APAC, Inc., Saratoga, Calif.

[21] Appl. No.: 781,743

[22] Filed: Oct. 23, 1991

[51] Int. Cl.$^5$ .............................................. G01C 17/28
[52] U.S. Cl. ...................................... 33/361; 324/260
[58] Field of Search ............. 33/361, 355 R; 324/260, 324/246

[56] References Cited

U.S. PATENT DOCUMENTS

| | | |
|---|---|---|
| 2,389,146 | 11/1945 | Fragola et al. |
| 2,424,562 | 7/1947 | Fragola ................................ 33/361 |
| 2,852,859 | 9/1958 | Depp . |
| 3,031,766 | 5/1962 | Schulte . |
| 3,601,899 | 8/1971 | Artz et al. |
| 3,657,641 | 4/1972 | Kardashian . |
| 3,657,641 | 4/1972 | Kardashian . |
| 3,942,258 | 3/1976 | Stucki et al. ........................ 33/361 |
| 4,262,233 | 4/1981 | Becker et al. |
| 4,262,427 | 4/1981 | Lynch et al. |
| 4,373,271 | 2/1983 | Nitz . |
| 4,413,424 | 11/1983 | Sasaki et al. |
| 4,445,279 | 5/1984 | Tsuchima et al. |
| 4,616,424 | 10/1986 | Arakawa et al. |
| 4,668,100 | 5/1987 | Murakami et al. |
| 4,739,263 | 4/1988 | Mohri et al. |
| 4,763,072 | 8/1988 | Katoh et al. |
| 4,849,696 | 7/1989 | Brun et al. |
| 4,864,238 | 9/1989 | Seitz . |
| 4,894,922 | 1/1990 | Lovelock . |
| 4,954,216 | 9/1990 | Hunter et al. |
| 4,967,156 | 10/1990 | Seitz . |
| 5,014,006 | 5/1991 | Seitz . |

OTHER PUBLICATIONS

Acker, "Calculation of the Signal Voltage Induced in a Toroidal Proton-Precession Magnetometer Sensor," *IEEE Transactions on Geoscience*, pp. 98-103 (Apr. 1971).

Liu et al., "A High Accuracy Magnetic Heading System Composed of Fluxgate Magnetometers and a Microcomputer," *IEEE*, pp. 148-152 (1989).

Lenz, "A Review of Magnetic Sensors," *Proceedings of the IEEE*, vol 78, No. 6, pp. 973-989 (Jun. 1990).

Gordon et al., "Factors Affecting the Sensitivity of Gamma-Level Ring-Core Magnetometers," *IEEE Transactions on Magnetics*, vol. MAG-1, No. 4, pp. 330-337 (Dec. 1965).

Barker, "On the Analysis of Second-Harmonic Modulators," *IEEE Transactions on Magnetics*, vol. MAG-1, No. 4, pp. 337-341 (Dec. 1965).

Acuna et al., "A Miniature Two-Axis Fluxgate Magnetometer," *IEEE Transactions on Geoscience Electronics*, pp. 252-260 (Oct. 1969).

Primary Examiner—Thomas B. Will
Assistant Examiner—C. W. Fulton
Attorney, Agent, or Firm—Majestic, Parsons, Siebert & Hsue

[57] ABSTRACT

A thin film magnetic fluxgate compass having a supporting substrate on which a layer of high permeability material, and at least two layers of nonmagnetic conducting materials are deposited; the high permeability material is fabricated to form a magnetic core or cores; a portion of the non-magnetic conducting layers is fabricated to form an excitation coil, magnetically coupled to the core or cores, which is to be connected to a pulse generator; the remainder of the non-magnetic conducting layers is fabricated into at least two sensing coils, or two pairs of sensing coils wound around the core or cores in opposite pairs, which are used to generate output signals. A method for the fabrication of the thin film compass is disclosed. The compass can be used for the determination of the direction of the geomagnetic field, and, because of its miniature size, for instrumentation that requires a very small magnetic field sensor.

10 Claims, 7 Drawing Sheets

THIN FILM COMPASS AND METHOD FOR MANUFACTURING THE SAME

BACKGROUND OF THE INVENTION

1. Field of the Invention

The present invention relates generally to a magnetic fluxgate (or flux valve) direction sensor (or flux sensor) for detecting the direction and magnitude of a magnetic field. Fluxgate sensors are used commercially in compass and direction bearing equipment.

The present invention is applicable to detect the direction and magnitude of a weak magnetic field such as geomagnetism.

The present invention relates more specifically to a thin film compass and a method for the fabrication of the same using thin film micro-fabrication technology, wherein improvements have been in the uniformity of the core cross section and excitation coil winding, in the precise alignment of the sensing coil windings, and in the reduction of the physical size of the sensor.

2. Description of the Prior Art

A prior geomagnetism fluxgate sensor has been shown in the M. F. Lynch et al. U.S. Pat. No. 4,262,427 for "Flux Valve Compass System," in the S. Arakawa et al. U.S. Pat. No. 4,616,424 for "Magnetic Direction Sensor," and in the K. Mohri et al. U.S. Pat. No. 4,739,263 for "Magnetic Sensor Using The Earth's Magnetism."

An example of such a fluxgate sensor is shown in FIG. 1. In the figure, the sensor has an O-ring shaped magnetic core C, on which an excitation coil Cc is wound. A pair of sensing coils Cx and Cy are also wound on the magnetic core so that each coil encircles the opposite portion of the magnetic core. The sensing coils are arranged perpendicular to each other so that they provide output voltage signals to determine the angle between the magnetic core and an external magnetic field whenever the excitation coil is energized by a pulse generator. The magnitude of the external magnetic field can also be determined from the output voltage signals.

Other than the O-ring shaped magnetic core, a known flux valve on earth's field directional pickoff is a structure having an equiangular "Y"-shaped core, as disclosed in the M. C. Depp U.S. Pat. No. 2,852,859 for "Flux Valve Compensating System." An example of such a fluxgate sensor is shown in FIG. 2. In C. F. Fragola U.S. Pat. No. 2,389,146 for "Flux Valve," a dual-core system was disclosed. Generally, the ring-shaped core is the most common configuration, which is made of materials having a high magnetic permeability, such as permalloy, ferromagnetic materials, and zero-magnetostrictive amorphous magnetic materials. This kind of core may be formed by winding a thin ribbon, or by bending a single or a bundle of thin wires, or using bars to form a circle or a polygon.

The magnetic fluxgate sensor of the ring-shaped core type is relatively good in detection sensibility. Its structure is simple and its subsequent signal-treating circuit is relatively simple. However, it has the following disadvantages due to the present manufacturing processes:

First, it is difficult to fabricate a magnetic core with uniform cross section to ensure a constant magnetic flux.

Further, automatic winding of a uniform excitation coil on a ring-shaped core is difficult, and non-uniform coil winding will cause a magnetic azimuth error to occur.

Further, it is difficult to obtain a uniform winding distribution in the sensing coils. When this happens, the directions of the input axis of the sensing coils are displaced from the desired direction with the result that a magnetic azimuth error occurs.

Further, the sensor is too large in size for practical use (for example, a prior sensor has a diameter of 10-50 mm, and a thickness of 3 mm).

Further, a permalloy core, if not protected and supported, is easily broken by vibration and/or shock.

A number of solutions have been proposed to alleviate the above problems. In U.S. Pat. No. 4,763,072 to Katoh et al., for example, a magnetic azimuth detector is proposed including an annular iron core and an annular hollow bobbin for a primary winding which incorporates therein the annular iron core. The bobbin has a number of protruded portions distributed evenly along a circumference of the annular bobbin to divide the circumference of the bobbin into sections of equal length between the protruded portions. The primary windings are wound around these sections of equal length with equal number of turns and in the same direction. Two secondary winding bobbins are shaped to fit on the two sides of the bobbin for the primary winding. Each of the two secondary winding bobbins has positioning means (e.g., partitioning protrusions) for registering the positions of the secondary winding bobbins with respect to the primary winding bobbin. The partitioning protrusions are also evenly distributed along the circumferences of the secondary winding bobbins to divide the circumferences into compartments of equal length, and the secondary windings are wound around compartments of equal length with an equal number of turns. It is stated in Katoh et al. that, by dividing the primary winding into smaller segments, it is easier to uniformly wind the winding around such small portions. By providing positioning means between the primary winding bobbins and the secondary winding bobbins, it is stated in Katoh et al. that it is possible to reduce the error of the magnetic sensor. Katoh et al.'s design is disadvantageous since large mechanical devices such as bobbins are required and small compasses cannot be made using such design. Furthermore, because of the difficulty in winding wires around bobbins accurately along predetermined paths, it would still be difficult to significantly reduce magnetic azimuth errors using Katoh et al.'s technique.

In U.S. Pat. No. 4,739,263 to Mohri et al. referenced above, another direction sensor is proposed comprising a ring-shaped core formed from at least one flexible wire and two pairs of series connected coils spaced from each other at equal intervals about the core for sensing an external magnetic field. The core is formed by threading the wires through the coils. Eventhough the wire used by Mohri et al. has smaller dimensions than the bobbins of Katoh et al., Mohri et al.'s design is still too big or too thick for many applications. Moreover, it is more difficult to wind wires accurately around another wire as compared to winding wires around larger mechanical supports such as bobbins, and to accurately fabricate sensor cores in the shape of circles or polygons by bending wires.

None of the above-described magnetic direction sensors or compasses is entirely satisfactory. It is therefore desirable to provide an improved magnetic field direction sensor or compass in which the above-described difficulties are overcome.

SUMMARY OF INVENTION

Accordingly, it is an object of this invention to provide an improved compass or other direction sensor which can overcome the disadvantages and limitations of the prior art direction sensors.

Another object of this invention is to provide an improved compass or other direction sensor which can position both an excitation-coil winding and sensing-coil windings with high accuracy.

Further object of this invention is to provide a compass or other direction sensor which is small in size, light in weight, simple in manufacturing process, and has high operational reliability.

Thin film vector magnetometers are known. Such magnetometers have been commonly used for recording or playing back information on magnetic tape in the computer industry. Typically the thin film magnetometer in such systems produces an output that varies linearly with a component of an externally applied magnetic field in the plane of the thin film chip portion of the magnetometer along a pre-defined sensitivity axis. In other words, such magnetometers measure only the magnitude of a certain component of an external magnetic field and not its direction. The above-described thin film magnetometers and the process for making such magnetometers are described, for example, in U.S. Pat. Nos. 4,954,216 to Hunter et al. and 4,967,156 to Seitz. Hunter describes a process of making a thin film magnetoresistive bridge magnetometer. Seitz uses magnetometers to identify the values of bank notes.

The present invention is based on the observation that, by using the process of making thin film magnetometers used in the computer data recording industry to fabricate the excitation and sensing coils of the magnetic flux gate or flux valve compass or other direction sensors, the above-described disadvantages of conventional flux gate or flux valve direction sensors can be avoided altogether. Since thin film techniques have been perfected to a high degree in other industries, it is now possible to implement the winding distributions and sensing coils to a high degree of accuracy. Therefore it is possible to achieve any chosen shape of magnetic core and uniform coil windings surrounding the core without much difficulty, thereby greatly reducing magnetic azimuth errors. Furthermore, by using thin film techniques, the size of the sensor can be greatly reduced to dimensions until now not possible with conventional direction sensors. Furthermore, by employing thin film techniques, the cores of the sensors would be adequately protected and supported by other layers surrounding the cores, so that the cores are no longer easily broken by vibration and/or shock. The core or cores would also maintain accurate alignment with the sensing and excitation coils despite shock to or vibration of the sensor which would make for a rugged device with versatile use.

The thin film magnetic compass of this invention includes a substrate and a plurality of layers on said substrate forming at least two sensing coils, an excitation coil, and a first magnetic core in the coils. In the preferred embodiment, at least two of the sensing coils have axes that are transverse to one another, so that when a compass is placed in a geomagnetic field and when said core is driven into magnetic saturation by means of said excitation coil, said sensing coils will provide signals for determining the direction of said geomagnetic field.

The above-described thin film compass can also be used to determine the direction of magnetic fields which are non-geomagnetic in nature.

In the preferred embodiment, the compass or magnetic field direction sensor is fabricated by proven thin film micro-fabrication technique described as follows:

The thin film magnetic fluxgate direction sensor of the present invention includes a substrate which is a material highly resistive to being magnetized and electrically non-conducting or semiconducting.

A first insulating layer is formed on the substrate. This layer is optional and can be omitted if desired.

A first conducting layer is deposited and fabricated to form the bottom portions of the excitation-coil and sensing-coils.

A second insulating layer is formed to insulate the bottom portions of the excitation-coil and sensing-coils from the magnetic core and any other electrically conductive layers to be formed next.

A thin-film layer of a magnetically permeable material is deposited and fabricated to form a magnetic core on the second insulating layer.

A third insulating layer is deposited on top of the thin film magnetic core to prevent the core from being electrically connected to other conductors.

Contact holes, cutting through the second and third insulating layers, are etched to allow the bottom and top portions of the excitation-coil and sensing-coils to be connected for electrical continuity. These holes are filled with an electrically conducting material to form vias.

A second conducting layer is deposited and fabricated to form the top portions of the excitation-coil and sensing-coils on the third insulating layer. These top portions are connected to their corresponding bottom portions through the vias in the contact holes, thus completing the excitation and sensing coil winding structures.

A fourth insulating layer is deposited as a scratch protection layer and pad openings are formed to allow electrical connection of the sensor to external electrical circuits for detecting and measuring the direction of external magnetic fields.

The sensor can be designed into a two-axis or other symmetrical configurations to provide the signal outputs needed for each particular method.

DESCRIPTION OF THE PREFERRED EMBODIMENT

Figure 1:
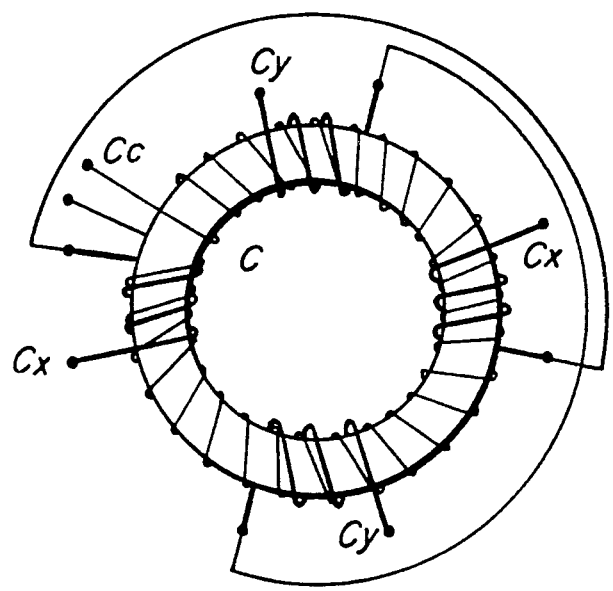
FIG. 1 is a schematic diagram of a prior art — ring-shaped fluxgate direction sensor.
Figure 2:
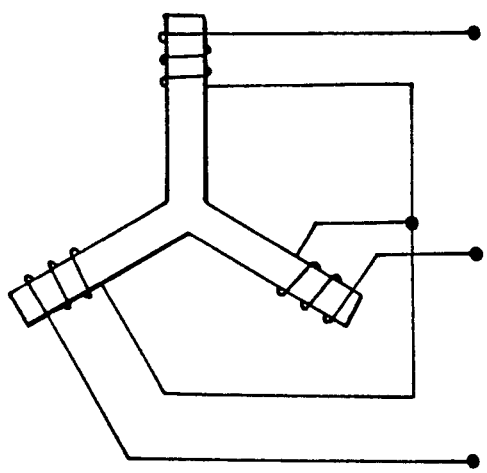
FIG. 2 is a schematic diagram of a prior art — "Y"-shaped fluxgate direction sensor.
Figure 3A:
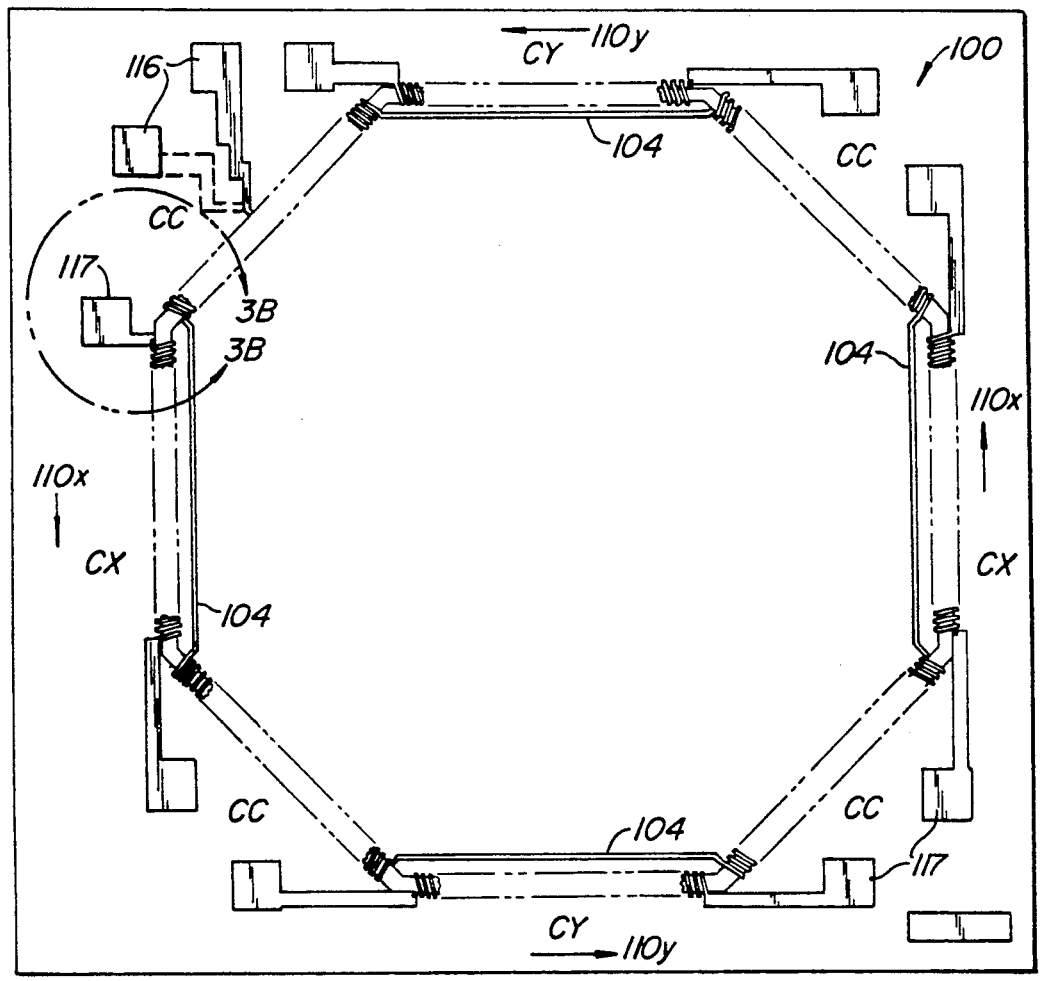
FIG. 3A is a schematic top view of a thin film fluxgate compass according to the present invention.
Figure 3B:
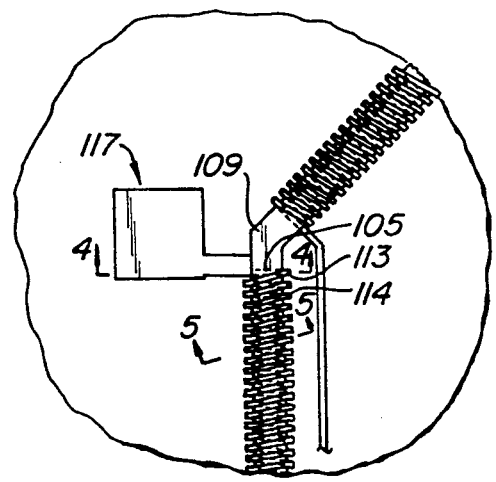
FIG. 3B is an exploded view of a portion of the compass of FIG. 3A within a circle 3B of FIG. 3A.
Figure 10:
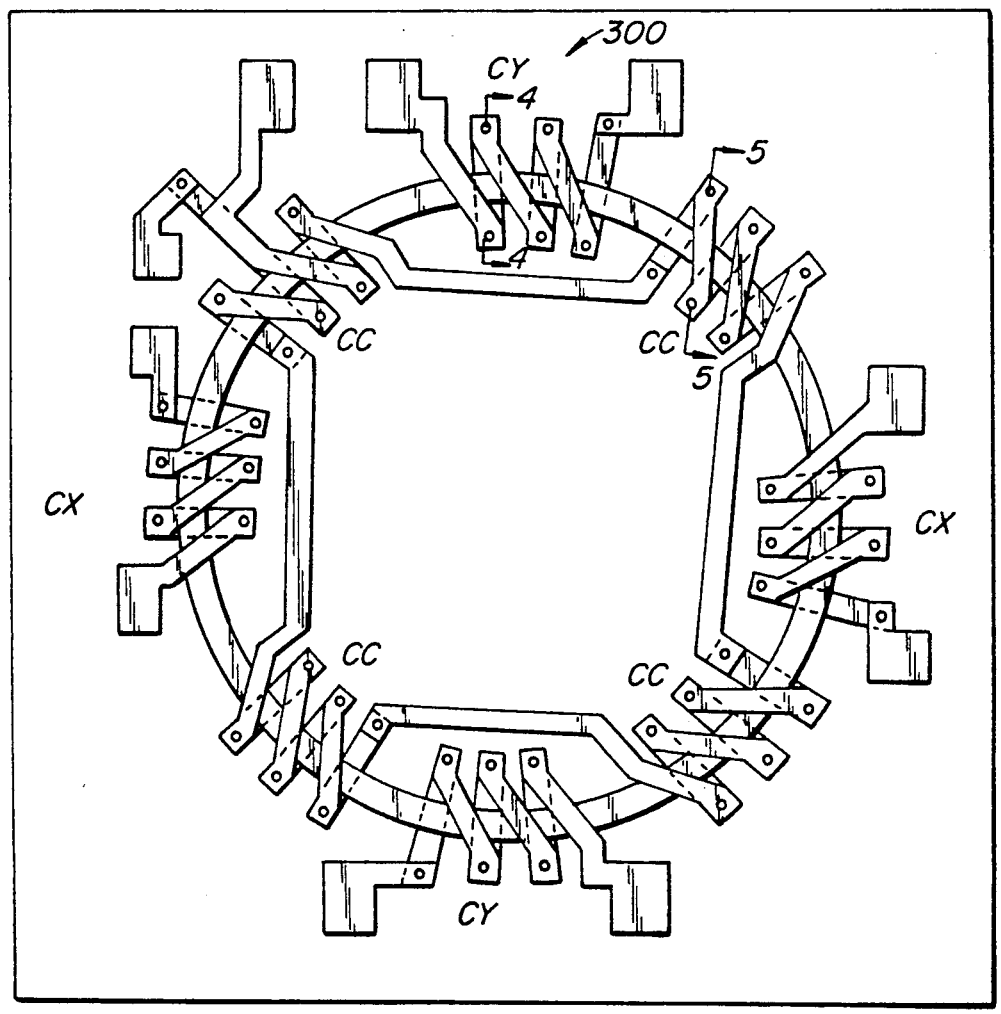
FIGS. 10 and 11 are schematic top views of two thin film flux gate compasses according to the present invention to illustrate still other embodiments of the invention where the cores of the compasses are substantially circular in shape.

FIG. 3A is a schematic top view of a thin film fluxgate compass 100 according to the present invention. FIG. 3B is an exploded view of the portion of the compass of FIG. 3A in circle 3B in FIG. 3A. In this figure, the compass has an octagonal magnetic core 109, which is surrounded by an excitation coil CC, although cores of other shapes such as circular cores (as shown in FIG. 10) may be used and are within the scope of the invention. A pair of sensing coils CX and CY also surround the magnetic core so that each coil encircles two opposite sides of the magnetic core, and each CX or CY coil is separated from a CY or CX coil along the octagonal core by a CC coil. The sensing coils are arranged so that their axes 110x, 110y are transverse to each other; in the preferred embodiment, each of axes 110x of coils CX is substantially perpendicular to each of axes 110y of coils CY. Through bonding pad 117, the sensing coils are connected externally to electrical circuits to provide output voltage signals to determine the angle between the magnetic core and an external magnetic field whenever the excitation coil is energized by a pulse generator (not shown).

The four excitation coils CC are connected through connecting lines 104 to a pair of bonding pads 116 for connection to external driving circuits. Thus each excitation coil CC is 90 degrees apart along the perimeter of the octagonal core 109 from an adjacent excitation coil, and is connected to the adjacent coil by an electrically conductive line 104.

Figure 4:
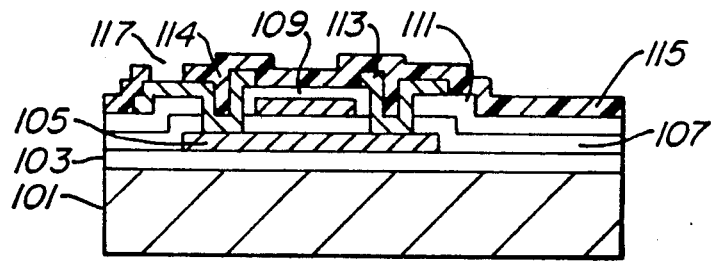
FIG. 4 is the cross-sectional view of the thin film fluxgate compass with single-layer coil structure according to the present invention of FIG. 3A along the line 4—4 in FIG. 3B.

Referring to FIG. 4, which is a cross-sectional view (not drawn to scale) of the compass structure along the line 4—4 in FIG. 3B, reference 101 represents a non-magnetic substrate such as silicon, glass, ceramic or aluminum oxide. This substrate has one surface overlaid with an optional first non-magnetic insulating layer 103 for electrically insulating the substrate from the bottom portions of an excitation-coil CC and sensing-coils CX, CY to be formed next.

Deposited on the first non-magnetic insulating layer 103 is a first non-magnetic electrical conducting material layer 105 such as copper or aluminum. A coil mask delineates on layer 105 the bottom portions of the excitation-coil and sensing-coils in a predetermined pattern by photo micro-fabrication technique, so that the unwanted portions are etched away leaving the bottom portions of the coils.

Deposited on the bottom portions of the excitation-coil and sensing-coils 105 and the optional insulating layer 103 is a layer of non-magnetic insulating layer 107, such as silicon dioxide, silicon monoxide, alumina, silicon nitride, polymer, or silicon carbonate.

Deposited on the second insulating layer 107 is a thin layer of a material having a high magnetic permeability, such as permalloy, ferromagnetic materials, and zero-magnetostrictive amorphous magnetic materials. This layer is then fabricated into a magnetic core 109, again using known photo-etching techniques. The layer forming the core is preferably less than 10 microns in thickness. The magnetic core 109 can be circular, polygonal, or "Y"-shaped. The dimensions of the core (e.g. diameter) is preferably in the range of about 0.1 to 20 mm.

After the magnetic core 109 formation, an optional tempering process may be carried out in a D.C. magnetic orienting field. The duration may range from 0.5 to 10 hours, the temperature may range from 200° to 500° C. The D.C. magnetic field should have a strength of >3 mT to achieve a stable and uniform easy axis of magnetization.

The third insulating layer 111 is a non-magnetic insulating material, deposited onto the magnetic core layer and the second inulating layer so as to prepare for the formation of the top portions of the excitation-coil and sensing-coils 113 over the magnetic core 109. The material used for layer 111 is similar to layer 107. By subsequent photo micro-fabrication technique, a set of contact holes 114 is created through insulating layers 107 and 111 to reach the first conducting layer 105. When these holes are filled with a conducting material forming vias, these vias would electrically connect a bottom portion to an appropriate top portion of an excitation-coil or sensing-coil.

Figure 5:
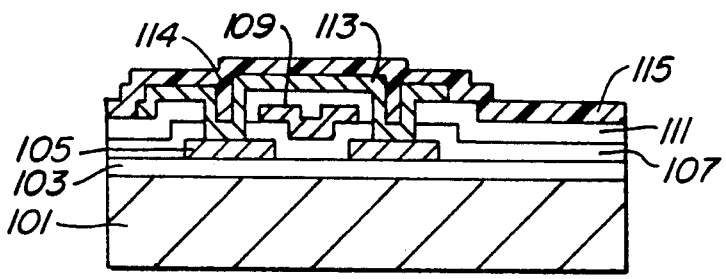
FIG. 5 is the cross-sectional view of the thin film fluxgate compass with single-layer coil structure according to the present invention of FIG. 3A along the line 5—5 in FIG. 3B.

Next, a second conducting layer 113 is deposited on top of the third insulating layer 111, filling or lining the holes 114 during the same deposition procedure. Layer 113 is shown more clearly in FIG. 5, which is a cross-sectional view (not drawn to scale) of the compass structure along the line 5—5 in FIG. 3B. By photo micro-fabrication technique the top portions of the excitation-coil and sensing-coils 113 are formed in a predetermined pattern. These top portions of the excitation-coil and sensing-coils 113 are connected to their corresponding bottom portions of the excitation-coil and sensing-coils 105 through the vias in the set of contact holes 114, thus completing the excitation and sensing coil winding structures.

The final insulating scratch protection layer 115 composed of silicon dioxide, silicon nitride or polyamide is deposited to provide a protective layer for the top portions of the excitation-coil and sensing-coils 113. By subsequent photo-etching technique, a pad opening 117 is created through the scratch protection layer 115. This pad opening 117 allows easy handling in testing and packaging.

The bottom and top portions of the excitation-coil and sensing-coils (105 and 113) can be formed on multiple conducting layers instead of on the single conducting layers of the aforementioned conventional direction sensors. The multiple layer design will employ two or more bottom and top portions of the excitation and sensing coils to increase the number of winding per unit length.

Figure 6:
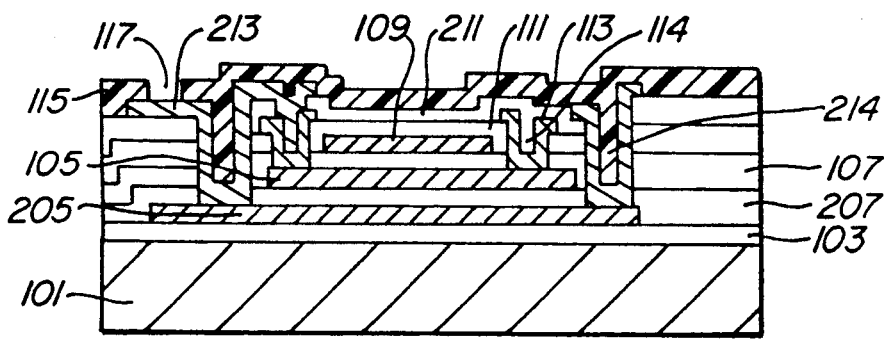
FIG. 6 is the cross-sectional view of a thin film fluxgate compass with double-layer coil structure according to the present invention.
Figure 7:
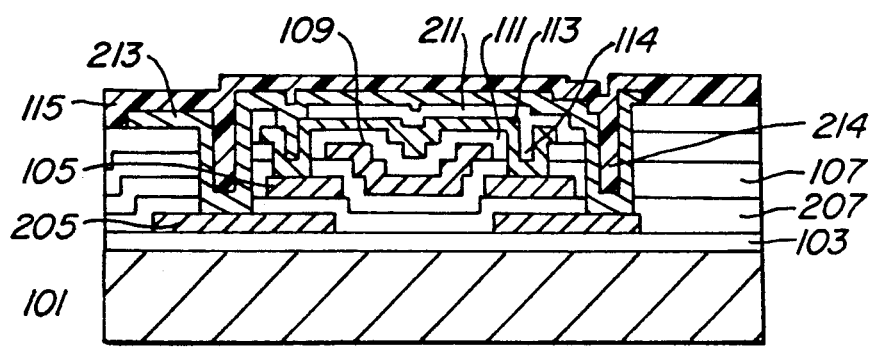
FIG. 7 is the cross-sectional view of the thin film fluxgate compass with double-layer coil structure according to the present invention of FIG. 6 but along a line at an angle to that of FIG. 6.

As shown in FIG. 6, in order to increase the signal to noise ratio, additional sensing and excitation coils may be employed in addition to and surrounding the coils of FIG. 3A. FIG. 6 is a cross-section view of a thin film fluxgate compass with a double coil structure, with an outer larger coil surrounding the coil described above in reference to FIGS. 3-5 depicting only a single coil. The larger coil is similar in structure to the above-described single coil, wherein structures of the larger coil labeled 205, 213, 214, 207, and 211 are counterparts of 105, 113, 114, 107, and 111 respectively of the smaller single coil described in reference to FIGS. 3-5. FIG. 7 is a cross-sectional view of the same double-layer coil structure as FIG. 6 but cut along a line at an angle to that of FIG. 6. The view in FIG. 6 of the double coil structure corresponds to the view of a single layer coil structure of FIG. 4, while the view in FIG. 7 corresponds to the view of the single layer coil structure in FIG. 5.

Certain applications may require thicker magnetic core to produce the desired results. In this case, the equivalent core thickness can be implemented through cores formed on multiple layers.

Figure 8:
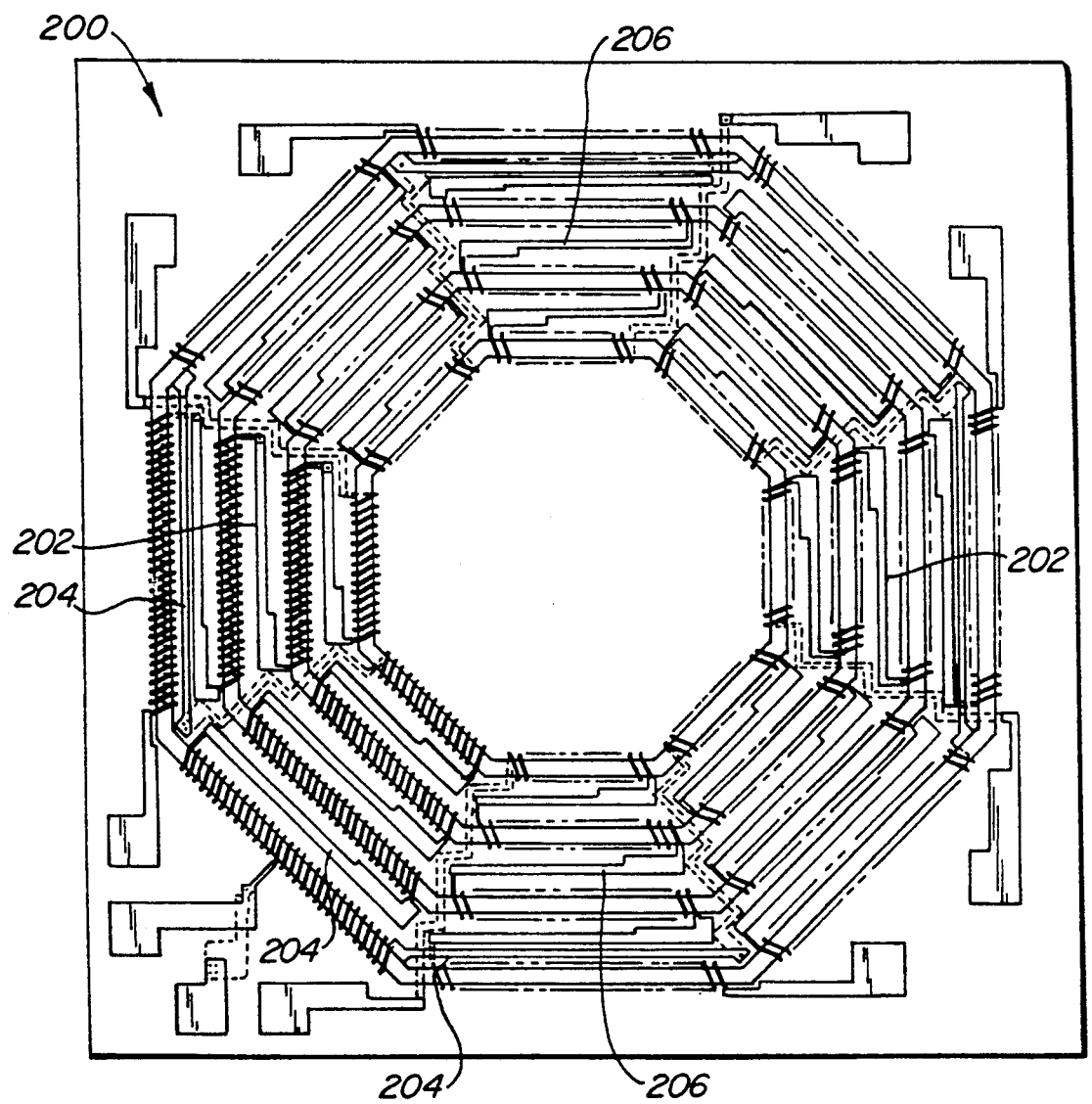
FIG. 8 is a schematic top view of a thin film fluxgate compass according to the present invention to illustrate another embodiment of the invention.

FIG. 8 is a schematic top view of a thin film flux gate compass 200 according to the present invention to illustrate another embodiment of the invention. As shown in FIG. 8, in order to increase the signal to noise ratio, additional magnetic cores in addition to a single core 109 of FIG. 3A may be employed. As shown in FIG. 8, three additional such cores are used. These three cores are also octagonal in shape and are of different sizes so that each core would enclose the next smaller core to form the configuration in FIG. 8. The four cores are preferably substantially coplanar with one another. The three additional cores are each surrounded by four excitation coils and two pairs of sensing coils in the same manner as coil 109 of FIG. 3A. Instead of providing separate contacts for each of the coils surrounding the four cores, connectors 202 are provided to connect the corresponding CX coils surrounding the corresponding sides of the four cores. Similarly, connecting lines 206 connect the CY coils surrounding the corresponding sides of the four cores. Connecting lines 204 connect the coils CC surrounding the corresponding sides of the four cores as well as connecting coils surrounding another group of sides of the octagonal cores 90° apart in the same manner as that described above for connecting lines 104 in FIG. 3A.

Figure 9:
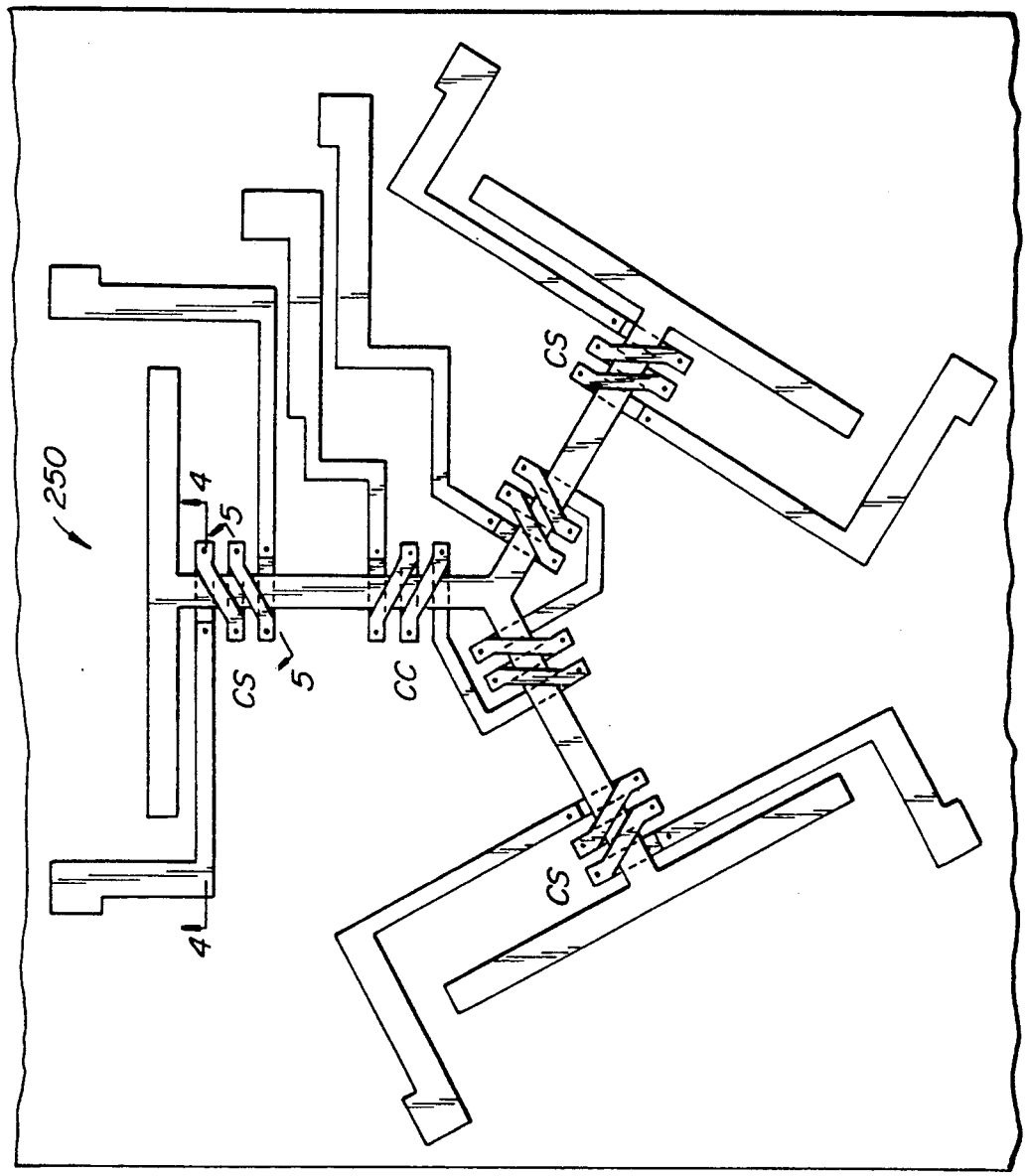
FIG. 9 is a schematic top view of a thin film flux gate compass according to the present invention to illustrate yet another embodiment of the invention where the core of the compass is in the shape of a "Y"

FIG. 9 is a schematic top view of a thin film flux gate compass 250 according to the present invention to illustrate yet another embodiment of the invention where the magnetic core of the compass is in the shape of "Y." The three sensing coils are labeled CS, and the three excitation coils CC. By reading or sensing the currents through the three sensing coils after the excitation coils are energized by a pulse generator (not shown), the direction of an external magnetic field can be found. The cross-sectional structure of compass 250 is similar to that of compass 100 of FIG. 3A. For example, the cross-sectional view of compass structure 250 along the lines 4—4 and 5—5 in FIG. 9 are the same as or similar to those shown in FIGS. 4 and 5.

FIG. 10 is a schematic top view of a thin film flux gate compass 300 according to the present invention to illustrate yet another embodiment of the invention where the magnetic core of the compass is substantially circular in shape. The sensing coils are labeled CX, CY and the excitation coils CC. The cross-sectional structure of compass 300 is similar to that of compass 100 of FIG. 3A. For example, the cross-sectional view of compass structure 300 along the lines 4—4 and 5—5 in FIG. 10 are the same as or similar to those shown in FIGS. 4 and 5.

Figure 11:
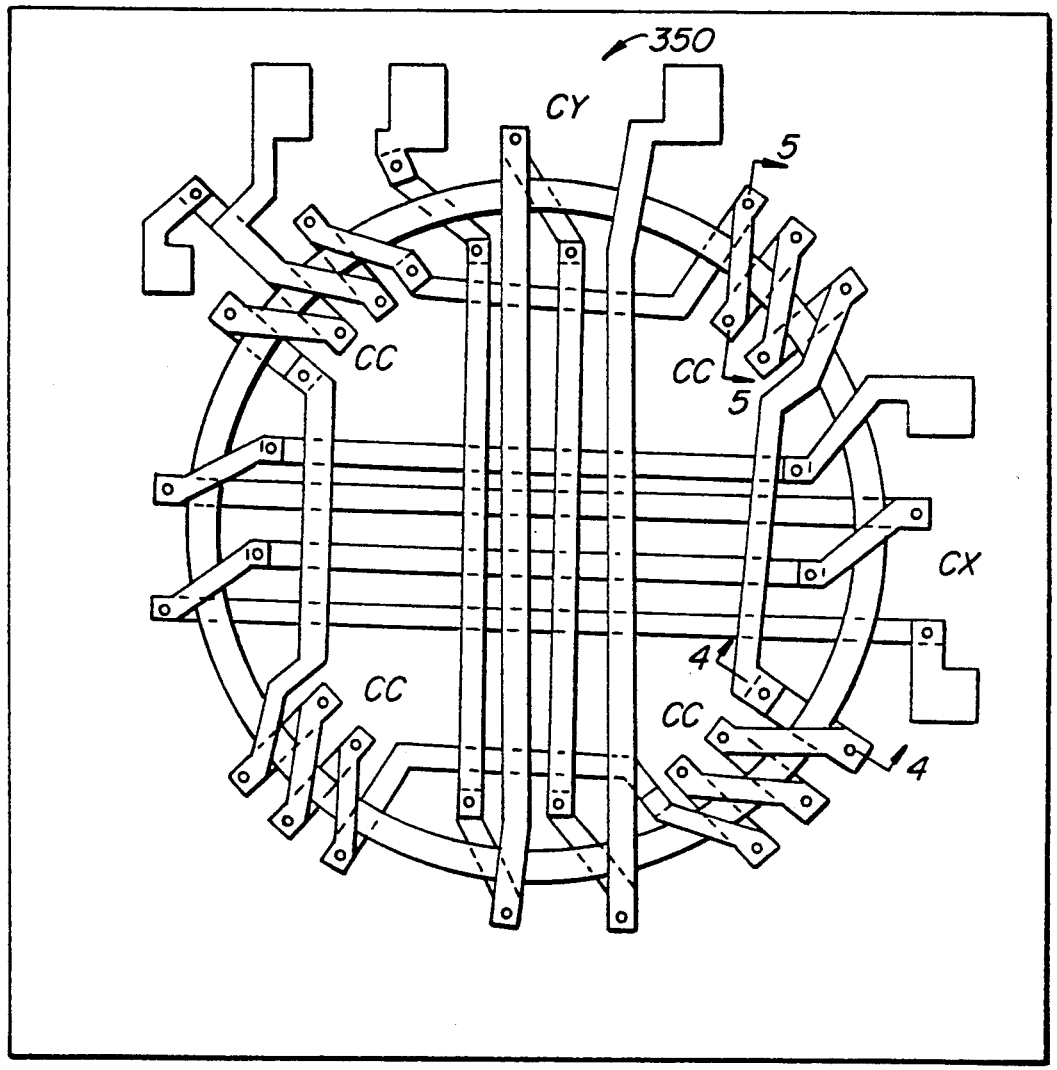

FIG. 11 is a schematic top view of a thin film flux gate compass 350 according to the present invention to illustrate yet another embodiment of the invention where only two sensing coils CX, CY are employed, each coil wound around a diameter of a substantially circular (or polygonal) core. The two diameters around which the two sensing coils are wound are transverse, and preferably orthogonal, to each other. The sensing coils are labeled CX, CY, and the excitation coils CC. The cross-sectional structure of compass 350 is similar to that of compass 100 of FIG. 3A. For example, the cross-sectional view of compass structure 350 along the lines 4—4 and 5—5 in FIG. 11 are the same as or similar to those shown in FIGS. 4 and 5.

From the above, it will be evident that the magnetic core of the direction sensor may take on a variety of shapes such as the "Y"-shape, circular shape, or the shape of any polygon, including a triangle or square. It is preferable for the polygon to have an even number of sides, with pairs of sensing coils and pairs of excitation coils located on opposite sides of the polygon, such as illustrated in FIG. 3A. The octagonal shaped core of FIG. 3A is particularly advantageous since it allows opposite pairs of CX, CY sensing coils to be wound around opposite sides of the octagonal core, where each pair of sensing coil is separated from the other pair of sensing coils along the core by a pair of excitation coils. While the concentric coil configurations of FIGS. 6 and 7 are illustrated and described by reference to octagonal shaped cores, it will be understood by reference that such concentric configurations can be implemented for sensors with cores of other shapes, such as the "Y"-shape, circular, or polygonal shapes other than octagonal. Similarly, the multiple core configuration of FIG. 8 may also be used where the core is circular, or polygonal other than octagonal. All such variations are within the scope of the invention.

While the invention has been described as primarily directed to the measurement of the direction of the Earth's magnetic field, it will be evident that the compass of this invention can be readily used for detecting the direction of other magnetic fields as well.

The above description is given on the preferred embodiments of this invention, but it will be apparent that many modifications and variations could be effected by one skilled in the art without departing from the spirits or scope of the novel concepts of the invention so that the scope of the invention should be determined by the appended claims only.

What is claimed is:

1. A thin film magnetic compass comprising:
   a substrate;
   a plurality of layers on said substrate forming a first group of at least two sensing coils, at least a first excitation coil, and a first magnetic core in said sensing and excitation coils, wherein said at least two sensing coils have axes that are transverse to one another, so that when said compass is placed in a geomagnetic field and when said core is driven into magnetic saturation by means of said excitation coil, said sensing coils will provide signals for determining the direction of said geomagnetic field;
   wherein said core is in the shape of a polygon having an even number of sides or a circle, said compass comprising a first and a second pair of sensing coils surrounding said core, wherein the two sensing coils in each of the two pairs have axes that are substantially parallel to each other but transverse to those of the axes of the other pair; said compass further comprising:

a least a substantially flat additional second magnetic core substantially coplanar with and surrounding said first magnetic core; and at least two additional pairs of sensing coils surrounding said second core.

2. The compass of claim 1, wherein said first and second cores are in the shape of octagons.

3. A thin film magnetic compass comprising:
a substrate;
a plurality of layers on said substrate forming a first group of at least two sensing coils, at least a first excitation coil, and a first magnetic core in said sensing and excitation coils, wherein said at least two sensing coils have axes that are transverse to one another, so that when said compass is placed in a geomagnetic field and when said core is driven into magnetic saturation by means of said excitation coil, said sensing coils will provide signals for determining the direction of said geomagnetic field, wherein said plurality of layers include:
a first conducting layer over said substrate, said conducting layer having a predetermined pattern to form bottom portions of said excitation and sensing coils;
a first insulating layer over said first conducting layer and said substrate;
a magnetic layer over said first insulating layer forming said magnetic core;
a second insulating layer over said magnetic layer and the first insulating layer;
a second conducting layer over said second insulating layer and having a predetermined pattern to form top portions of said excitation and sensing coils; and
vias means through the first and second insulating layers and connected to the top and bottom portions of said excitation-coil and sensing-coils to form the coils.

4. The compass of claim 3, wherein said first and second conducting layers are each in the shape of an array of strips, wherein the strips in the array of the first conducting layer are oriented transverse to the strips in the array of the second conducting layer.

5. The compass of claim 3, further comprising:
a third insulating layer over said second conducting layer, said third insulating layer having therein a pad opening to allow electrical connection between said compass and external circuits.

6. The compass of claim 3, further comprising additional sensing and excitation coils which comprise:
a second group of sensing coils, each sensing coil in the second group surrounding a sensing coil in the first group; and
a second excitation coil surrounding the first excitation coil 7. The compass of claim 6, the additional sensing and excitation coils comprising:
a third conducting layer between the first conducting layer and the substrate, said third conducting layer having a predetermined pattern to form bottom portions of said additional sensing and excitation coils;
a third insulating layer between the first and third conducting layers;
a fourth insulating layer over the second conducting layer;
a fourth conducting layer over the fourth insulating layer, said fourth conducting layer having a predetermined pattern to form top portions of said additional sensing and excitation coils; and
via means through the insulating layers connecting the third and fourth conducting layers to form said additional sensing and excitation coils.

8. The compass of claim 3, further comprising a third insulating layer between the substrate and the first conducting layer.

9. A thin film magnetic compass comprising:
a substrate;
a plurality of layers on said substrate forming a first group of at least two sensing coils, at least a first excitation coil, and a first magnetic core in said sensing and excitation coils, wherein said at least two sensing coils have axes that are transverse to one another, so that when said compass is placed in a geomagnetic field and when said core is driven into magnetic saturation by means of said excitation coil, said sensing coils will provide signals for determining the direction of said geomagnetic field, wherein said core has been tempered by having been heated for a period of 0.5 to 10 hours at a temperature in a range between 200° to 500° C., in a magnetic orienting field applied to the core in a direction along a surface of said core, so that said core exhibits an easy axis of magnetization in the direction of the orienting field.

10. The compass of claim 9, wherein the magnetic orienting field of the core has a strength of at least 3 mT.

* * * * *